United States Patent
Yagyu et al.

(10) Patent No.: US 7,538,367 B2
(45) Date of Patent: May 26, 2009

(54) AVALANCHE PHOTODIODE

(75) Inventors: Eiji Yagyu, Tokyo (JP); Eitaro Ishimura, Tokyo (JP); Masaharu Nakaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/515,857

(22) Filed: Sep. 6, 2006

(65) Prior Publication Data

US 2007/0096236 A1  May 3, 2007

(30) Foreign Application Priority Data

Sep. 12, 2005 (JP) ............................. 2005-263470

(51) Int. Cl.
*H01L 29/739* (2006.01)
*H01L 31/0328* (2006.01)
*H01L 31/0336* (2006.01)
*H01L 31/072* (2006.01)
*H01L 31/109* (2006.01)
*H01L 29/861* (2006.01)
*H01L 31/107* (2006.01)
*H01L 29/00* (2006.01)
*H01L 29/864* (2006.01)

(52) U.S. Cl. .................. 257/199; 257/481; 257/482; 257/551; 257/603; 257/604; 257/605; 257/606; 257/E29.335

(58) Field of Classification Search ................ 257/199, 257/481–482, 551, 603–606, 29.335
See application file for complete search history.

(56) References Cited

U.S. PATENT DOCUMENTS

| | | | | |
|---|---|---|---|---|
| 4,213,138 A | * | 7/1980 | Campbell et al. ........... 257/184 |
| 4,442,444 A | | 4/1984 | Osaka ......................... 257/186 |
| 4,481,523 A | | 11/1984 | Osaka et al. ................. 257/186 |
| 4,684,969 A | * | 8/1987 | Taguchi ....................... 257/438 |
| 4,857,982 A | | 8/1989 | Forrest ......................... 257/186 |
| 4,876,209 A | | 10/1989 | Forrest ........................... 438/91 |
| 4,894,703 A | * | 1/1990 | Hamamsy et al. ........... 257/189 |
| 4,906,583 A | * | 3/1990 | Kagawa et al. ................ 438/91 |
| 4,935,795 A | * | 6/1990 | Mikawa et al. .............. 257/438 |
| 5,144,381 A | * | 9/1992 | Furuyama et al. ........... 257/186 |

(Continued)

FOREIGN PATENT DOCUMENTS

JP  57-42176  3/1982

(Continued)

*Primary Examiner*—Ida M Soward
(74) *Attorney, Agent, or Firm*—Oblon, Spivak, McClelland, Maier & Neustadt, P.C.

(57) ABSTRACT

The present invention provides an avalanche photodiode capable of raising productivity. An n-type InP buffer layer, an n-type GaInAs light absorption layer, an n-type GaInAsP transition layer, an n-type InP electric field adjusting layer, an n-type InP avalanche intensifying layer, an n-type AlInAs window layer and a p-type GaInAs contact layer are grown in order on an n-type InP substrate. Next, Be is ion-injected into an annular area along the outer periphery of a light receiving area which is activated by heat treatment so as to form an inclined joint, to obtain a p-type peripheral area for preventing an edge break down. Further, Zn is selectively diffused thermally into the light receiving area until it reaches the n-type InP avalanche intensifying layer so as to form a p-type conductive area.

10 Claims, 7 Drawing Sheets

U.S. PATENT DOCUMENTS

| | | | |
|---|---|---|---|
| 5,272,364 A * | 12/1993 | Hironaka | 257/185 |
| 5,352,628 A * | 10/1994 | Funaba | 438/508 |
| 6,294,414 B1 * | 9/2001 | Levine | 438/183 |
| 6,518,638 B1 * | 2/2003 | Kuhara et al. | 257/431 |
| 6,784,512 B2 * | 8/2004 | Kuhara et al. | 257/440 |
| 6,844,607 B2 * | 1/2005 | Shirai et al. | 257/443 |
| 7,259,408 B2 * | 8/2007 | Yagyu et al. | 257/186 |
| 2005/0242372 A1 * | 11/2005 | Iwasaki et al. | 257/184 |

FOREIGN PATENT DOCUMENTS

| | | |
|---|---|---|
| JP | 58-48478 | 3/1983 |
| JP | 62-043185 | 2/1987 |
| JP | 63-285977 | 11/1988 |
| JP | 06188447 A * | 7/1994 |
| JP | 2002151727 A * | 5/2002 |
| JP | 2004-200302 | 7/2004 |
| WO | WO 2006/046276 A1 | 5/2006 |

\* cited by examiner

F I G . 4
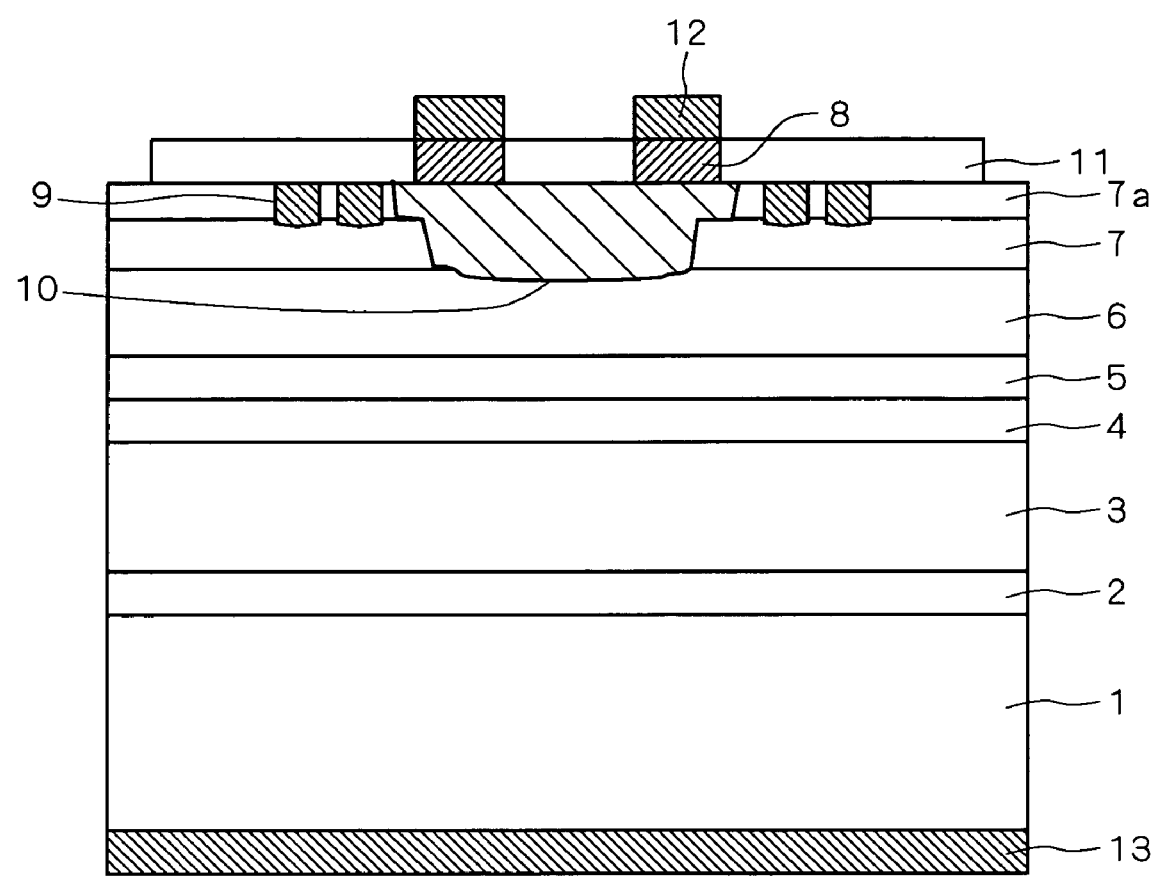

F I G . 6
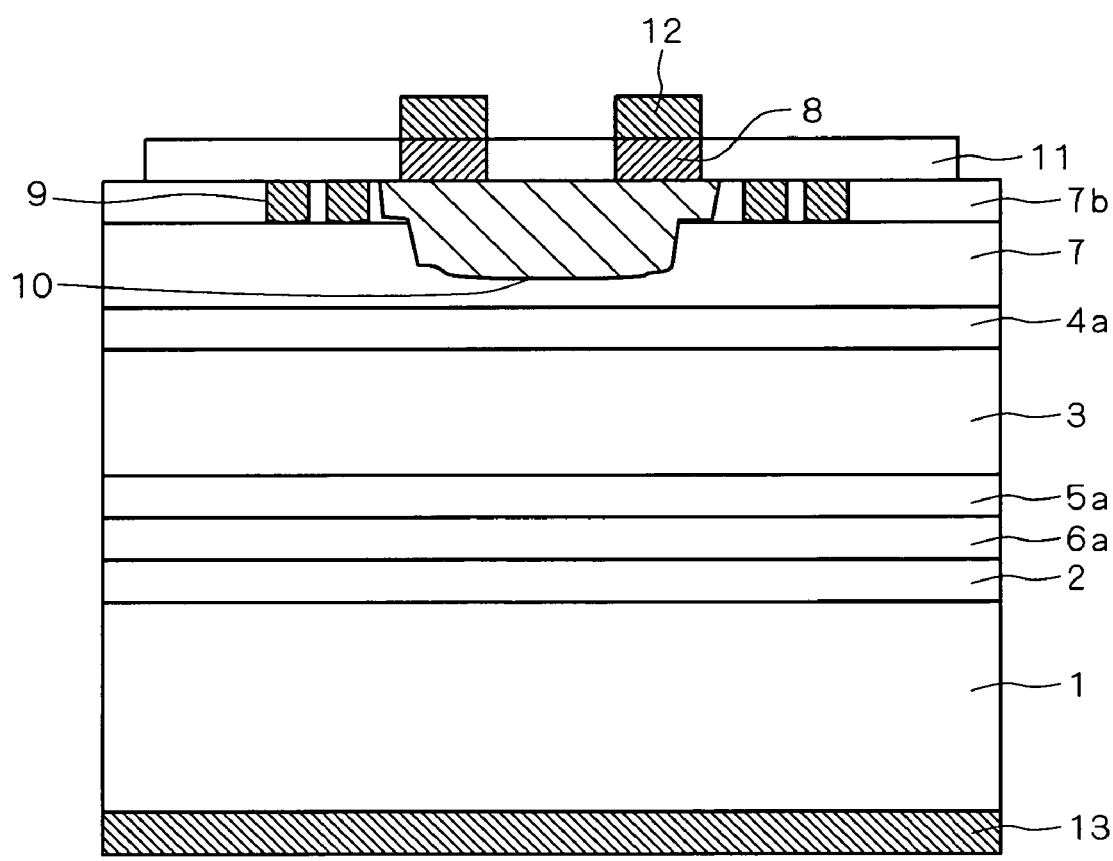

AVALANCHE PHOTODIODE

BACKGROUND OF THE INVENTION

1. Field of the Invention

The present invention relates to an avalanche photodiode, more particularly to a technology for raising productivity.

2. Description of the Background Art

A diode structure actually used and including the aforementioned avalanche photodiode is of a planer type structure in which either one conductive type of pn-conductive types is formed as a selective area, while having long-term reliability. Particularly, a diode using a compound semiconductor lattice-matched to InP for use in optical communications and the like utilizes, as the aforementioned selective area, a p-type conductive area in which Zn is diffused thermally in the InP having a low conductivity as a p-conductive type impurity. The avalanche photodiode is further provided with a p-type conductive area called a guard ring on its outer periphery in order to prevent a local voltage drop called edge break-down due to concentration of an electric field to the periphery of the p-type conductive area. This p-type conductive area is formed by ion injecting Be (see, for example, Japanese Patent Application Laid-Open No. 58-48478 (1983) (FIG. 2)) or diffusing Zn thermally (see, for example, U.S. Pat. No. 4,857,982 (FIG. 2)).

Japanese Patent Application Laid-Open No. 2004-200302 (see FIG. 1) discloses an avalanche photodiode in which at least an (i-type) AlInAs avalanche intensifying layer, a GaInAs light absorption layer and an InP window layer are overlaid in order as a semiconductor on an InP substrate so as to form the p-type conductive area in the InP window layer. The avalanche photodiode having a high reliability and a low dark current can be easily achieved without necessity of manufacturing the guard ring because an electric field intensity in the InP window layer can be weakened by disposing the AlInAs avalanche intensifying layer below the GaInAs light absorption layer. In the meantime, according to Japanese Patent Application Laid-Open No. 2004-200302 (see FIG. 1), the p-type conductive area is provided by diffusing Zn thermally.

Because a conventional avalanche photodiode is structured as described above, the diffusion depth of Zn may determine the thickness of i-layer of a pin diode structure and further determine the intensifying layer thickness of the avalanche photodiode. Accordingly, the Zn diffusion depth needs to be controlled precisely in order to obtain desired device characteristics such as a frequency characteristic, an electric characteristic and a capacity. However, it is difficult to control the thermal diffusion depth of an impurity accurately with excellent reproducibility without any dispersion of accuracy in its wafer plane. Therefore, there exists such a problem that the yield drops thereby reducing productivity.

SUMMARY OF THE INVENTION

An object of the present invention is to provide an avalanche photodiode capable of raising productivity.

According to a first aspect of the present invention, there is provided an avalanche photodiode in which at least a light absorption layer, an avalanche intensifying layer and a semiconductor window layer are overlaid in order as semiconductor layers on an InP substrate, and a conductive area is formed in the semiconductor window layer by diffusing Zn, wherein the semiconductor window layer includes a third group/fifth group semiconductor layer constituted of a third group element and a fifth group element and composed of mainly In and As.

The diffusion velocity can be lowered as compared to a conventional avalanche photodiode in which Zn is diffused thermally into InP because Zn is diffused thermally in the third group/fifth group semiconductor layer composed of mainly In and As. Therefore, an avalanche photodiode having excellent reproducibility and yield, easy to manufacture and ensuring a high productivity can be achieved.

According to a second aspect of the present invention, there is provided an avalanche photodiode in which at least an avalanche intensifying layer, a light absorption layer and a semiconductor window layer are overlaid in order as semiconductor layers on an InP substrate, and conductive area is formed in the semiconductor window layer by diffusing Zn, wherein the semiconductor window layer includes a third group/fifth group semiconductor layer constituted of a third group element and a fifth group element and composed of mainly In and As.

The diffusion velocity can be lowered as compared to a conventional avalanche photodiode in which Zn is diffused thermally into InP because Zn is diffused thermally in the third group/fifth group semiconductor layer composed of mainly In and As. Therefore, an avalanche photodiode having excellent reproducibility and yield, easy to manufacture and ensuring a high productivity can be achieved. Further, the electric field intensity of the semiconductor window layer can be weakened.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view showing a schematic structure of an avalanche photodiode according to a second embodiment;

FIG. 6 is a sectional view showing a schematic structure of an avalanche photodiode according to the third embodiment.

DESCRIPTION OF THE PREFERRED EMBODIMENTS

First Embodiment

Figure 1:
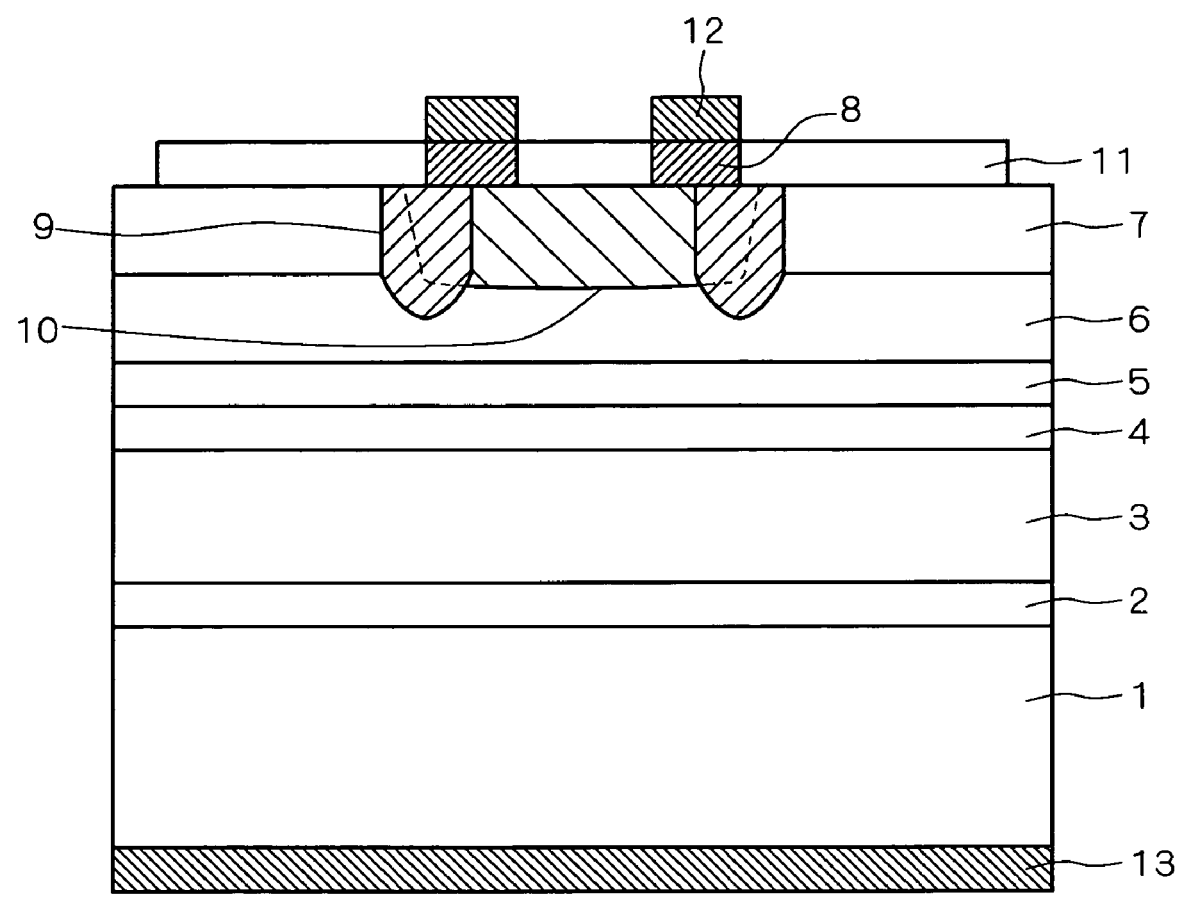
FIG. 1 is a sectional view showing a schematic structure of an avalanche photodiode according to a first embodiment.

FIG. 1 is a sectional view showing a schematic structure of avalanche photodiode according to the first embodiment. Formation of each semiconductor layer on a semiconductor substrate (InP substrate) can be achieved using an organic metal vapor growth method (MO-CVD), a molecular beam epitaxial growth method (MBE) or the like on an n-type InP substrate 1. This embodiment adopts the following step order.

On the n-type InP substrate 1, the n-type InP buffer layer 2 having a carrier density of 1 to $5 \times 10^{18}$ cm$^{-3}$ is grown in a thickness of 0.1 to 1 µm, an n-type GaInAs light absorption layer 3 having a carrier density of 0.1 to $3\times10^{15}$ cm$^{-3}$ in a thickness of 1 to 3 µm, an n-type GaInAsP transition layer 4 having a carrier density of 0.1 to $3\times10^{15}$ cm$^{-3}$ in which a band gap is increased gradually in a thickness of 0.1 to 0.5 µm, an n-type InP electric field adjusting layer 5 having a carrier density of 0.1 to $1\times10^{18}$ cm$^{-3}$ in a thickness of 0.01 to 0.1 µm, an n-type InP avalanche intensifying layer 6 having a carrier density of 0.01 to $1\times10^{16}$ cm$^{-3}$ in a thickness of 0.2 to 0.8 µm, an n-type AlInAs window layer 7 having a carrier density of 0.01 to $1\times10^{16}$ cm$^{-3}$ in a thickness of 0.5 to 2.0 µm, and an n-type GaInAs contact layer (which turns to a p-type GaInAs contact layer 8 in a later process) having a carrier density of 0.01 to $1\times10^{15}$ cm$^{-3}$ in a thickness of 0.1 to 0.5 µm, successively.

Next, a p-type peripheral area 9 is formed by activating an annular area having a width of 5 to 20 µm into a p-conductive type by heat treatment with ion injecting Be, on the outer periphery of a light receiving area (which coincides with a p-type conductive area 10 described later in FIG. 1) having a diameter of 20 to 100 µm. The p-type peripheral area 9 functions as a guard ring for preventing edge break down by forming an inclined type joint.

Further, Zn is selectively diffused thermally in the light receiving area until it reaches the n-type InP avalanche intensifying layer 6 using a SiNx film (not shown) bored circularly as a mask to form the p-type conductive area 10 in an unmasked circular portion. In the meantime, the thermal diffusion of Zn can be carried out according to a vapor phase diffusion method using organic Zn or metal Zn as a diffusion source or according to a solid phase diffusion method in which a ZnO film is formed and diffused for a predetermined time period under a high temperature in a nitrogen environment. The p-type GaInAs contact layer 8 is formed by converting the aforementioned n-type GaInAs contact layer into p-type in this thermal diffusion of Zn.

Subsequently, the central portion of the p-type GaInAs contact layer 8 is etched to leave the p-type GaInAs contact layer 8 in a form of a ring having a width of 5 to 10 µm on the p-type conductive area 10. Further, a SiNx surface protecting film/reflection preventing film 11 is formed by vapor deposition, and the SiNx surface protecting film/reflection preventing film 11 existing on the p-type GaInAs contact layer 8 is removed so as to form a p-type electrode 12 on the p-type GaInAs contact layer 8 with AuZn/Au. Further, a face of the n-type InP substrate 1 on an opposite side to the face on which the n-type InP buffer layer 2 is laminated is ground to form an n-type electrode 13 with AuGe/Ni/Au. Further, the wafer-like n-type InP substrate 1 is cut and separated to devices of about 300 µm square. An avalanche photodiode is formed by executing a predetermined processing on this device. In the avalanche photodiode in FIG. 1 of this embodiment, the p-type conductive area 10 cannot be accommodated completely in the n-type AlInAs window layer 7 but penetrates to reach the n-type InP avalanche intensifying layer 6.

Figure 2:
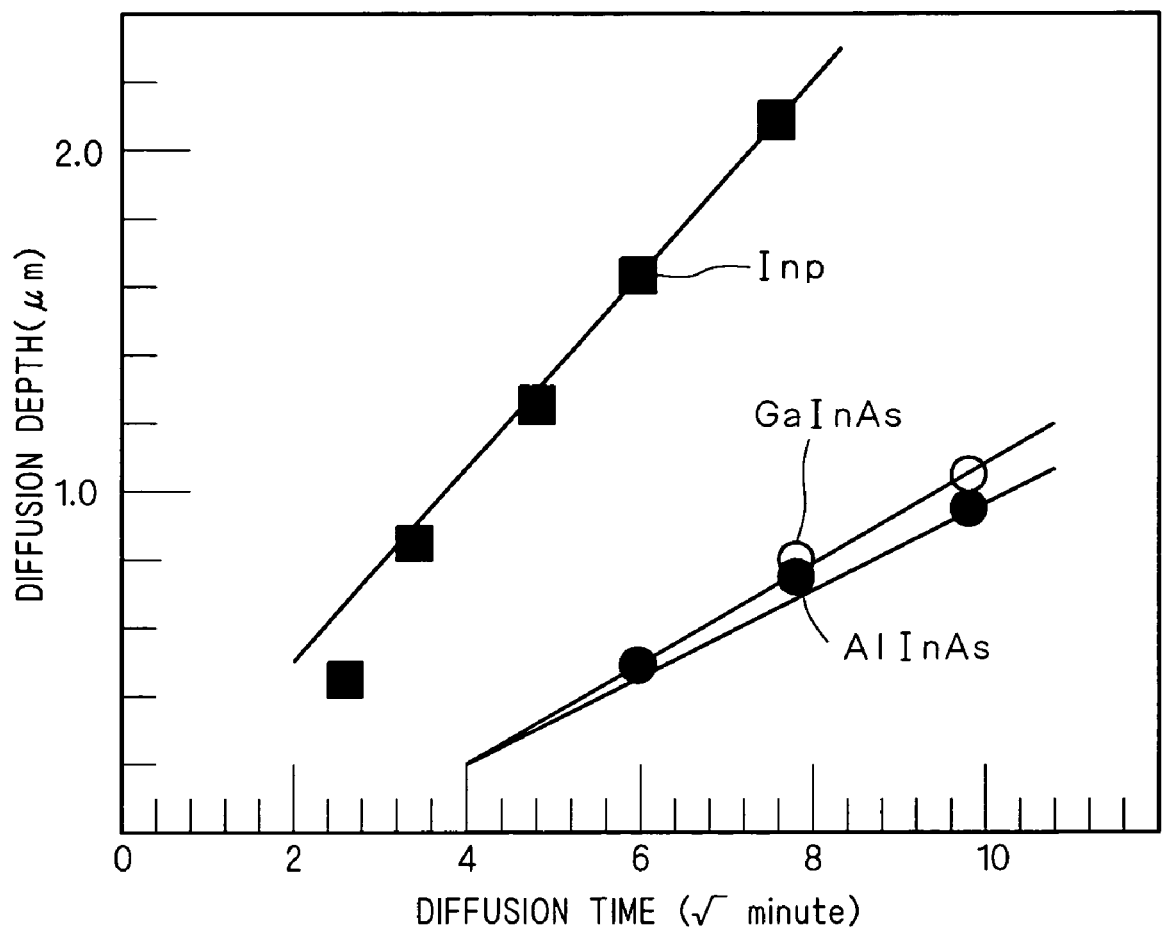
FIG. 2 is a graph showing a relation between a thermal diffusion time and a diffusion depth of Zn to each compound semiconductor.

FIG. 2 is a graph showing the relation between the thermal diffusion time and the diffusion depth of Zn at an annealing temperature of 490° C. in respective compound semiconductors (InP, GaInAs and AlInAs). Although the diffusion depth differs depending on the kind of a diffused impurity and the kind of a semiconductor in which such impurity is diffused, it is almost proportional to square root of the diffusion time. Zn is diffused in InP relatively fast and in AlInAs or GaInAs relatively slowly. The diffusion depth thereof in AlInAs and GaInAs is about ⅖ times the diffusion depth in InP and the diffusion depth in AlInAsP and GaInAsP is of intermediate value between these values. The diffusion depth is most largely affected in a case of being diffused in InP under changes with a time passage and a controlling constant of the device so that its fluctuation is large. Although, as described above, the diffusion depth of Zn determines the i-layer thickness and the intensifying layer thickness of the pin diode structure, in a case of being diffused in InP, controllability and reproducibility in manufacturing are the lowest because a production margin decreases and the characteristic in the wafer does not become uniform. Further, little diffusion is caused until the aforementioned compound semiconductor warms up to the anneal temperature during thermal treatment because the diffusion velocity is largely dependent on the temperature. Therefore, if the diffusion time is short, an influence of the aforementioned fluctuation is likely to be received because the diffusion depth is extremely small.

As described above, because Zn is diffused thermally in AlInAs (n-type AlInAs window layer 7), the avalanche photodiode of this embodiment can lower the diffusion velocity as compared to a conventional avalanche photodiode in which Zn is diffused thermally in InP. Therefore, even at an initial timing of the diffusion in which the anneal temperature is low, the diffusion velocity is stabilized so that the influence of fluctuation is unlikely to be received. Accordingly, the Zn diffusion depth can be controlled accurately with excellent reproducibility and without any dispersion in the wafer plane. The avalanche photodiode is unlikely to be affected by changes of a characteristic with a time passage of a diffusion apparatus or a diffusion time so as to be robust, since the margin of the processing time can be enlarged. Therefore, an avalanche photodiode having excellent reproducibility and a yield, easy to manufacture and ensuring a high productivity can be achieved. Further, the window layer can be thinned thereby reducing time required for crystal growth because the diffusion can be controlled precisely even if the diffusion depth is small.

Figure 3:
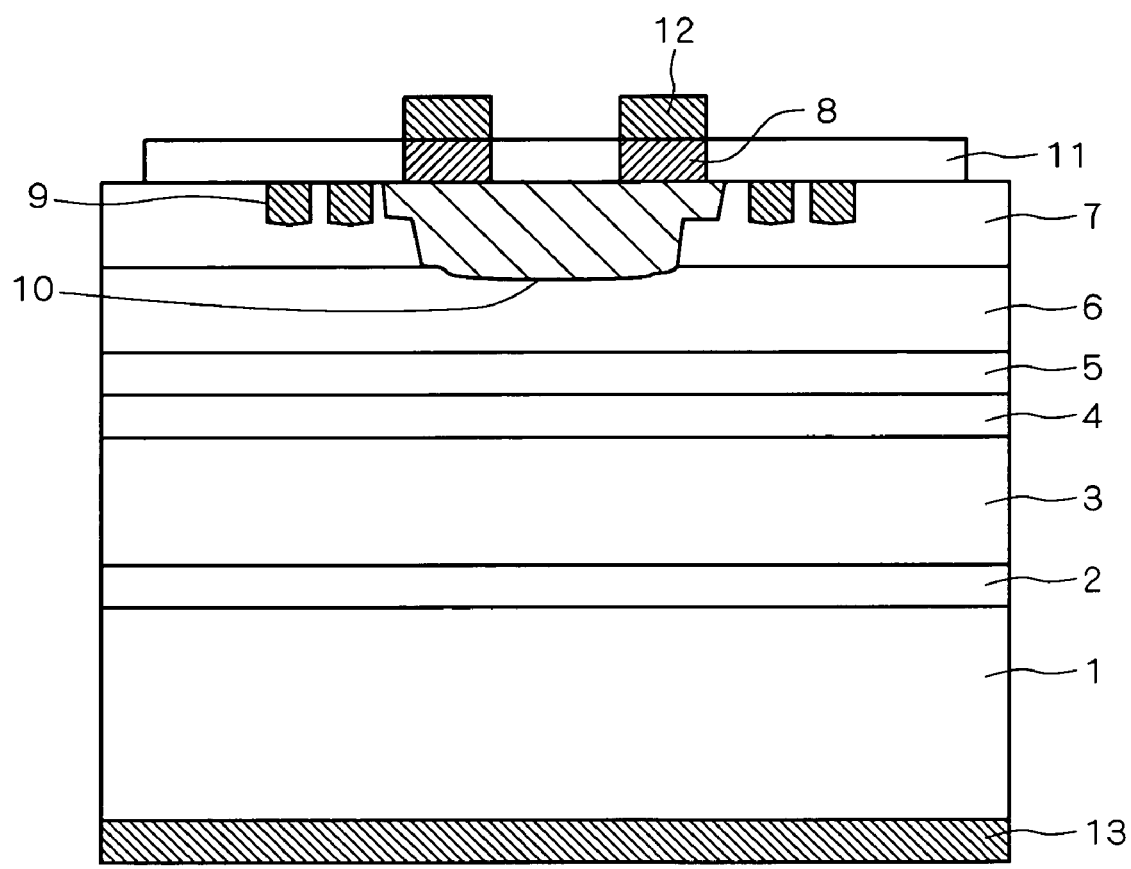
FIG. 3 is a sectional view showing a schematic structure of the avalanche photodiode according to the first embodiment.

Although according to the structure of FIG. 1, the p-type peripheral area 9 is formed by ion-injecting Be on the outer periphery of light receiving area (p-type conductive area 10), this embodiment is not restricted to this example, but the p-type peripheral area 9 may be formed by diffusing Zn thermally apart from the outer periphery of the light receiving area. The p-type peripheral area 9 enables its depth to be controlled precisely by forming Zn by thermal diffusion like the p-type conductive area 10. Further, the p-type peripheral area 9 may be formed shallower than the p-type conductive area 10 apart from the outer periphery of the light receiving area. Although it is likely to be affected by the fluctuation if the p-type peripheral area 9 is formed shallow, the fluctuation can be reduced by diffusing Zn thermally in AlInAs as described above. In FIG. 3, the central portion of the p-type conductive area 10 is deep while an end portion thereof is projected toward the p-type peripheral area 9 located outside. As a result, concentration of electric field and current in the peripheral portion of the p-type conductive area 10 is relaxed to lower the surface electric field intensity thereby stabilizing the intensifying operation and improving the long term reliability. Further, because the size on the side of the front surface can be set large while the size of the inside can be set small, the capacity of the device can be decreased.

Although a case of using AlInAs as the material of the window layer has been described above, this embodiment is not restricted to this example, but any material may be adopted if its band gap is large so that a detected beam can be passed through and its diffusion velocity is lower than InP, and any ternary material or material of more compounds such as GaInAs, AlGaInAs, GaInAsP and AlGaInAsP may be adopted. That is, any material is permitted as long as it contains a semiconductor layer which is constituted of the third group element and the fifth group element and composed of mainly In and As (the third group/the fifth group semiconductor layer). Such a structure enables the window layer to be lattice-matched to the n-type InP substrate 1 and the diffusion velocity to be slower than InP.

Although the window layer is used because beam is allowed to enter from an opposite side to the n-type InP substrate in the above description, this window layer is expressed as cap layer if beam is allowed to enter from the side of the substrate or the side face (same in the second and third embodiments)

Second Embodiment

In the first embodiment, the diffusion depth can be controlled precisely by constituting the window layer with only AlInAs in which Zn is diffused more slowly than InP. However, production time sometimes may be excessively long if the window layer is constituted of only AlInAs. In such a case, the window layer does not need to be constituted of only AlInAs or may be constituted with InP partially contained in addition to AlInAs.

FIG. 4 is a sectional view showing a schematic structure of avalanche photodiode according to the second embodiment. Formation of each semiconductor layer on a semiconductor substrate (InP substrate) can be achieved using an organic metal vapor growth method (MO-CVD), a molecular beam epitaxial growth method (MBE) or the like on an n-type InP substrate 1. This embodiment adopts following step order.

On the n-type InP substrate 1, the n-type InP buffer layer 2 having a carrier density of 1 to $5 \times 10^{18}$ cm$^{-3}$ is grown in a thickness of 0.1-1 µm, an n-type GaInAs light absorption layer 3 having a carrier density of 0.1 to $3 \times 10^{15}$ cm$^{-3}$ in a thickness of 1 to 3 µm, an n-type GaInAsP transition layer 4 having a carrier density of 0.1 to $3 \times 10^{15}$ cm$^{-3}$ in which band gap is increased gradually in a thickness of 0.1 to 0.5 µm, an n-type InP electric field adjusting layer 5 having a carrier density of 0.1 to $1 \times 10^{18}$ cm$^{-3}$ in a thickness of 0.01 to 0.1 µm, an n-type InP avalanche intensifying layer 6 having a carrier density of 0.01 to $1 \times 10^{16}$ cm$^{-3}$ in a thickness of 0.2 to 1.2 µm, an n-type AlInAs window layer 7 having a carrier density of 0.01 to $1 \times 10^{16}$ cm$^{-3}$ in a thickness of 0.1 to 0.5 µm, an n-type InP window layer 7a having a carrier density of 0.01 to $1 \times 10^{16}$ cm$^{-3}$ in a thickness of 0.1 to 2.0 µm and an n-type GaInAs contact layer (which turns to a p-type GaInAs contact layer 8 in a later process) having a carrier density of 0.01 to $1 \times 10^{15}$ cm$^{-3}$ in a thickness of 0.1 to 0.5 µm, successively.

Next, the p-type peripheral area 9 is formed by diffusing Zn thermally into an annular area 3 to 10 µm in width apart from the outer periphery of light receiving area 20 to 100 µm in diameter. The p-type peripheral area 9 functions as a guard ring for preventing edge break down by forming an inclined type joint like the first embodiment.

Further, Zn is selectively diffused thermally in the light receiving area until it reaches the n-type InP avalanche intensifying layer 6 using a SiNx film (not shown) bored circularly as a mask to form the p-type conductive area 10 in an unmasked circular portion. An end portion of this p-type conductive area 10 is projected to the p-type peripheral area 9 located outside like shown in FIG. 3. In the meantime, the thermal diffusion of Zn can be carried out according to vapor phase diffusion method which uses organic Zn or metal Zn as a diffusion source or according to solid phase diffusion method in which ZnO film is formed and diffused for a predetermined time period under high temperatures in a nitrogen environment. The p-type GaInAs contact layer 8 is formed by converting the aforementioned n-type GaInAs contact layer into p-type in this thermal diffusion of Zn like the first embodiment.

Subsequently, the central portion of the p-type GaInAs contact layer 8 is etched to leave the p-type GaInAs contact layer 8 in a form of a ring having a width of 5 to 10 µm on the p-type conductive area 10. Further, a SiNx surface protecting film/reflection preventing film 11 is formed by vapor deposition and the SiNx surface protecting film/reflection preventing film 11 existing on the p-type GaInAs contact layer 8 is removed so as to form a p-type electrode 12 on the p-type GaInAs contact layer 8 with AuZn/Au. Further, a face of the n-type InP substrate 1 on an opposite side to the face on which the n-type InP buffer layer 2 is laminated is ground to form an n-type electrode 13 with AuGe/Ni/Au. Further, the wafer-like n-type InP substrate 1 is cut and separated to devices of about 300 µm square. An avalanche photodiode is formed by executing predetermined processing on this device. In the avalanche photodiode in FIG. 4 of this embodiment, the p-type conductive area 10 cannot be accommodated completely in the n-type AlInAs window layer 7 but penetrates to reach the n-type InP avalanche intensifying layer 6, like the avalanche photodiode shown in FIGS. 1 and 4 of the first embodiment.

The avalanche photodiode shown in FIG. 4 is constituted by thinning the n-type AlInAs window layer 7 (and the n-type InP avalanche intensifying layer 6) in the avalanche photodiode of FIG. 3 of the first embodiment and adding the n-type P window layer 7a thereon. The production time can be reduced by constituting the window layer not of only AlInAs but with InP having a fast diffusion velocity partially contained. That is, the production time can be reduced with the diffusion depth controlled precisely by adjusting the percentages of AlInAs and InP contained in the window layer arbitrarily.

As described above, the avalanche photodiode of this embodiment is constituted not of only AlInAs but with InP contained partially. Therefore, in addition to the effect of the first embodiment, an effect of reducing working time can be exerted.

Third Embodiment

In the first and second embodiments, as shown in FIGS. 1, 3, 4, the p-type peripheral area 9 is provided to prevent edge break down. However, the edge break down can be prevented without providing the p-type peripheral area 9 which functions as a guard ring because the electric filed strength in the window layer can be weakened by disposing the avalanche intensifying layer below the light absorption layer as disclosed in Japanese Patent Application Laid-Open No. 2004-200302 (see FIG. 1).

Figure 5:
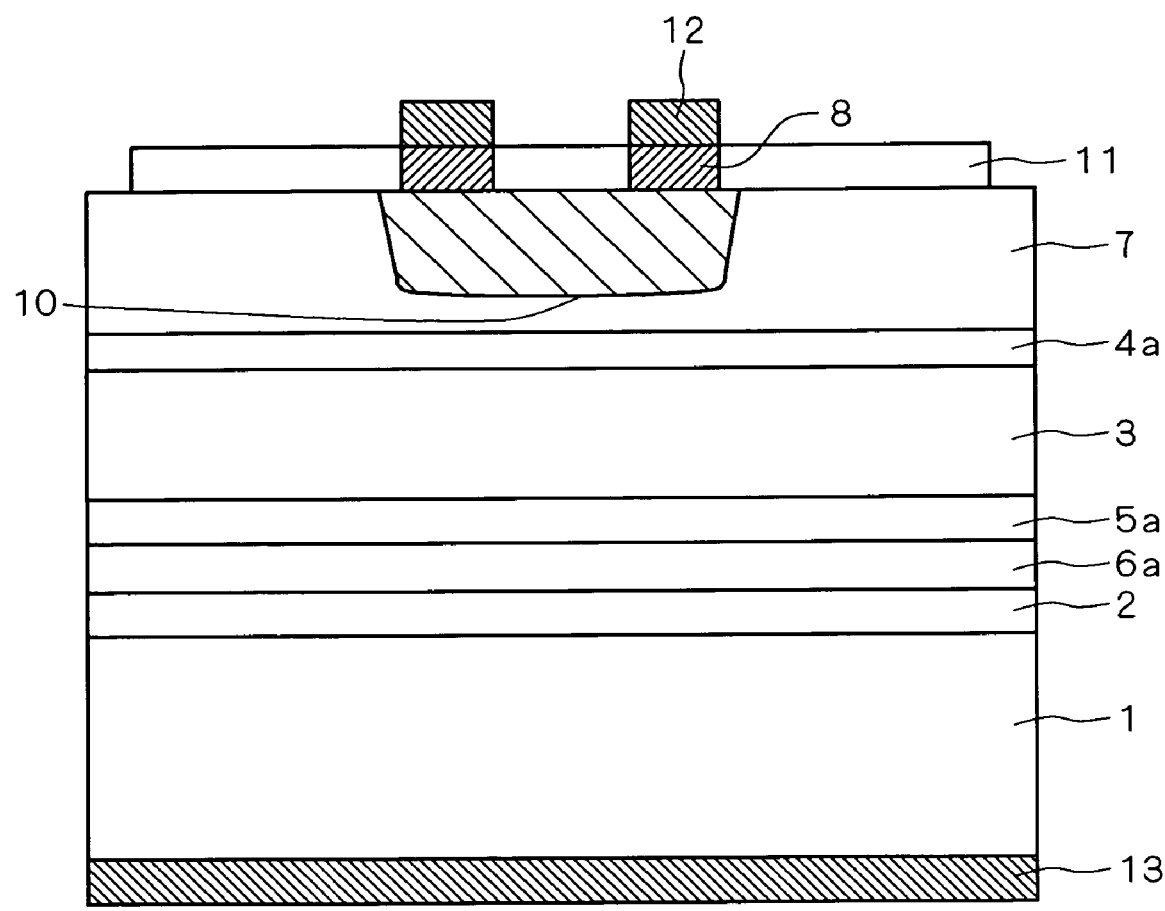
FIG. 5 is a sectional view showing a schematic structure of an avalanche photodiode according to a third embodiment.

FIG. 5 is a sectional view showing a schematic structure of the avalanche photodiode according to the third embodiment. Formation of each semiconductor layers on a semiconductor substrate (InP substrate) can be achieved using an organic metal vapor growth method (MO-CVD), a molecular beam epitaxial growth method (MBE), or the like on an n-type InP substrate 1. This embodiment adopts following step order.

On the n-type InP substrate 1, the n-type InP buffer layer 2 having a carrier density of 1 to $5 \times 10^{18}$ cm$^{-3}$ is grown in a thickness of 0.1 to 1 µm, an n-type AlInAs avalanche intensifying layer 6a having a carrier density of 0.1 to $3 \times 10^{16}$ cm$^{-3}$ in a thickness of 0.1 to 0.5 µm, a p-type InP electric field adjusting layer 5a having a carrier density of 0.1 to $1 \times 10^{18}$ cm$^{-3}$ in a thickness of 0.01 to 0.1 µm, an n-type GaInAs light absorption layer 3 having a carrier density of 0.1 to $3 \times 10^{15}$ cm$^{-3}$ in a thickness of 1 to 3 μm, an n-type AlGaInAs transition layer 4a having a carrier density of 0.1 to 3×10$^{15}$ cm$^{-3}$ in which band gap is increased gradually in a thickness of 0.1 to 0.5 μm, an n-type AlInAs window layer 7 having a carrier density of 0.01 to 1×10$^{16}$ cm$^{-3}$ in a thickness of 0.5 to 2.0 μm, and an n-type GaInAs contact layer (which turns to a p-type GaInAs contact layer 8 in a later process) having a carrier density of 0.01 to 1×10$^{15}$ cm$^{-3}$ in a thickness of 0.1 to 0.5 μm, successively.

Next, Zn is selectively diffused thermally in the n-type AlInAs window layer (does not reach the n-type AlGaInAs transition layer 4a) using a SiNx film (not shown) bored circularly as a mask to form the p-type conductive area 10 in an unmasked circular portion. In the meantime, the thermal diffusion of Zn can be carried out according to vapor phase diffusion method which uses organic Zn or metal Zn as a diffusion source or according to solid phase diffusion method in which ZnO film is formed and diffused for a predetermined time period under high temperatures in a nitrogen environment, like the first and second embodiments. The p-type GaInAs contact layer 8 is formed by converting the aforementioned n-type GaInAs contact layer into p-type in this thermal diffusion of Zn, like the first and second embodiments.

Subsequently, the central portion of the p-type GaInAs contact layer 8 is etched to leave the p-type GaInAs contact layer 8 in a form of a ring having a width of 5 to 10 μm on the p-type conductive area 10. Further, a SiNx surface protecting film/reflection preventing film 11 is formed by vapor deposition and the SiNx surface protecting film/reflection preventing film 11 existing on the p-type GaInAs contact layer 8 is removed so as to form a p-type electrode 12 on the p-type GaInAs contact layer 8 with Ti/Au. Further, a face of the n-type InP substrate 1 on an opposite side to the face on which the n-type InP buffer layer 2 is laminated is ground to form an n-type electrode 13 with AuGe/Ni/Au. Further, the wafer-like n-type InP substrate 1 is cut and separated to devices of about 300 μm square. An avalanche photodiode is formed by executing predetermined processing on this device.

According to the avalanche photodiode of FIG. 5, instead of the n-type GaInAsP transition layer 4, the n-type InP electric field adjusting layer 5 and the n-type InP avalanche intensifying layer 6 disposed the n-type GaInAs light absorption layer 3 in the avalanche photodiode shown in FIG. 1 of the first embodiment, an n-type AlGaInAs transition layer 4a is provided on the n-type GaInAs light absorption layer 3 and the p-type InP electric field adjusting layer 5a and an n-type AlInAs avalanche intensifying layer 6a are provided under the n-type GaInAs light absorption layer 3, and the p-type peripheral area 9 is omitted and further, the p-type conductive area 10 is formed such that it can be accommodated in the n-type AlInAs window layer 7 completely without projecting into the n-type AlGaInAs transition layer 4a. That is, the electric field intensity of the n-type AlInAs window layer 7 can be weakened to omit the p-type peripheral area 9 as mentioned in Japanese Patent Application Laid-Open No. 2004-200302 (see FIG. 1) by disposing the n-type AlInAs avalanche intensifying layer 6a under the n-type GaInAs light absorption layer 3. Further, discontinuous quantity of valence band in the window layer and transition layer is reduced to keep flow of holes from disturbance by using the n-type AlGaInAs transition layer 4a containing no P (contains only As as a fifth group atom) instead of the n-type GaInAsP transition layer 4 containing P as a transition layer interposed between the n-type GaInAs light absorption layer 3 and the n-type AlInAs window layer 7.

As described above, the avalanche photodiode of this embodiment can weaken the electric field intensity of the n-type AlInAs window layer 7 in addition to the effect of the first embodiment because the n-type AlInAs avalanche intensifying layer 6a is disposed under the n-type GaInAs light absorption layer 3.

Although a case where the p-type peripheral area 9 is omitted has been described with reference to FIG. 5 above, it is permissible to form the p-type peripheral area 9 like the first and second embodiments. Consequently, the long-term reliability of the avalanche photodiode can be intensified because the electric field intensity of the n-type AlInAs window layer 7 can be weakened further by forming the p-type peripheral area 9.

Figure 7:
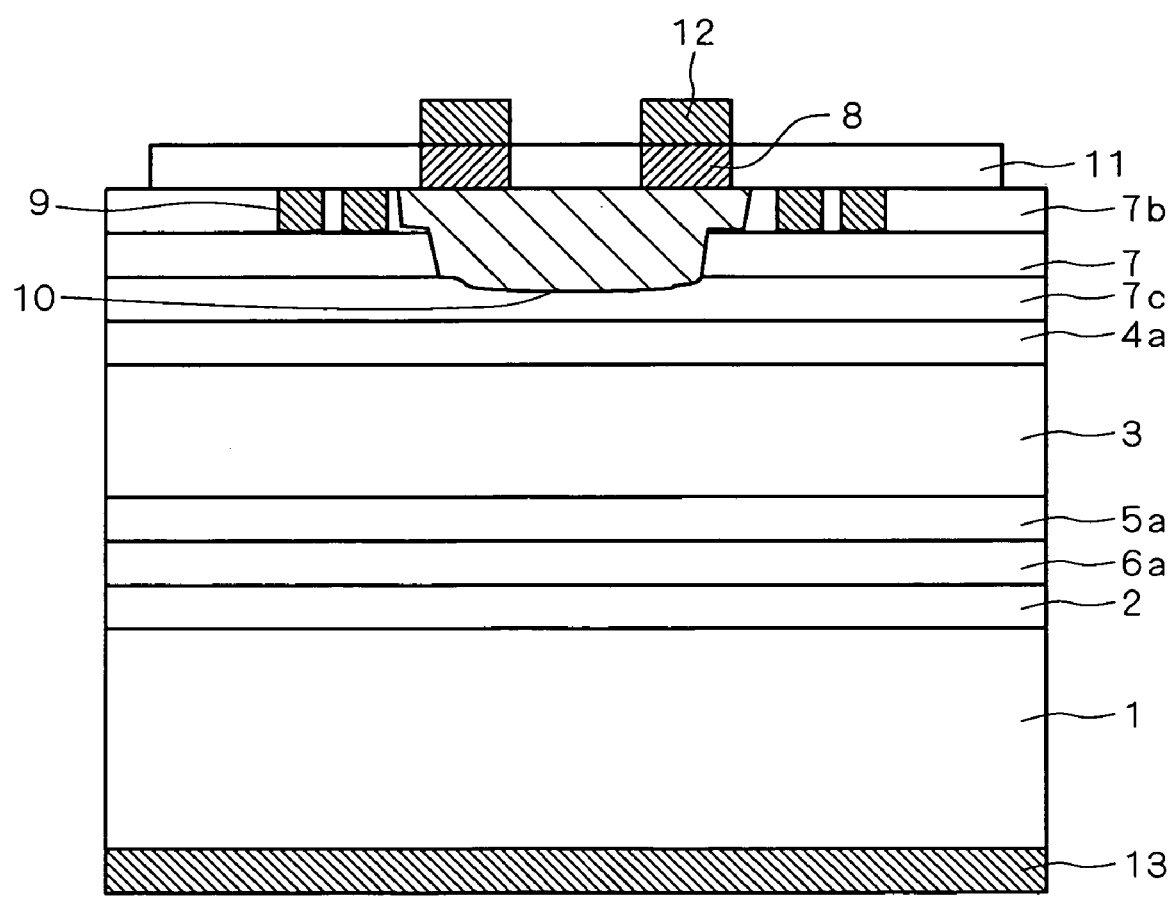
FIG. 7 is a sectional view showing a schematic structure of an avalanche photodiode according to the third embodiment.

Although a case where the window layer is of single layer structure constituted of only the n-type AlInAs window layer 7 has been described with reference to FIG. 5 above, the window layer may be of double layer structure as shown in FIG. 6. FIG. 6 shows an example in which the window layer is of double layer structure by interposing the InP window layer 7b between the n-type AlInAs window layer 7 and the SiNx surface protecting film/reflection preventing film 11 and the p-type peripheral area 9 is formed in FIG. 5 like the examples shown in FIGS. 3 and 4. In FIG. 6, the n-type AlInAs window layer may be formed thinner than in FIG. 5 as long as its thickness is 0.1 μm or more (preferably, 0.3 μm or more, more preferably, 0.5 μm or more). The window layer may be of a three-layer structure as shown in FIG. 7. FIG. 7 shows an example in which the window layer is of three layer structure by interposing the InP window layer 7c between the n-type AlInAs window layer 7 and the n-type AlGaInAs transition layer 4a. Production time can be reduced like the second embodiment by providing the InP window layers 7b, 7c as well as the n-type AlInAs window layer 7.

Although a case where the n-type AlGaInAs transition layer 4a containing no P is used as the transition layer has been described above, a window layer containing P may be used instead of the n-type AlInAs window layer 7 if GaInAsP transition layer containing P is used as material of the transition layer.

Although the surface incident type in which beam is injected from an opposite side using the n-type InP substrate 1 has been described above, the semiconductor substrate may be used as back side incident type in which n electrode 13 is electrically connected to the n-type buffer layer 2 and beam is injected from the substrate side or as a waveguide type structure in which beam is injected from its side face.

While the invention has been shown and described in detail, the foregoing description is in all aspects illustrative and not restrictive. It is therefore understood that numerous modifications and variations can be devised without departing from the scope of the invention.

What is claimed is:

1. An avalanche photodiode comprising:
   a light absorption layer, an avalanche intensifying layer and a semiconductor window layer overlaid in order as semiconductor layers on an InP substrate; and
   a conductive area formed in said semiconductor window layer by diffusing Zn, wherein
   said semiconductor window layer in which said conductive area is formed includes a first window layer and a second window layer formed under said first window layer and composed of a material diffusing Zn slower than said first window layer.

2. The avalanche photodiode according to claim 1, wherein said first window layer includes an InP layer; and said second window layer includes a third group/fifth group semiconductor layer that includes a third group element and a fifth group element and composed mainly of In and As.

3. The avalanche photodiode according to claim 2, wherein said third group/fifth group semiconductor layer includes any one of an AlInAs layer, an AlGaInAs layer and a GaInAsP layer.

4. The avalanche photodiode according wherein to claim 1, wherein
   a p-type peripheral area is provided around said conductive area in said semiconductor window layer; and
   said p-type peripheral area is formed shallower than said conductive area.

5. The avalanche photodiode according to claim 1, wherein said conductive area has a cross-sectional shape whose width is larger in said first window layer than in said second window layer.

6. An avalanche photodiode comprising:
   an avalanche intensifying layer, a light absorption layer and a semiconductor window layer overlaid in order as semiconductor layers on an InP substrate; and
   a conductive area is formed in said semiconductor window layer by diffusing Zn, wherein
   said semiconductor window layer in which said conductive area is formed includes said first window layer and said second window layer formed under said first window layer and composed of a material diffusing Zn slower than said first window layer.

7. The avalanche photodiode according to claim 6, wherein
   said first window layer includes an InP layer; and
   said second window layer includes a third group/fifth group semiconductor layer that includes a third group element and a fifth group element and composed mainly of In and As.

8. The avalanche photodiode according to claim 6, wherein
   said third group/fifth group semiconductor layer includes any one of an AlInAs layer, an AlGaInAs layer and a GaInAsP layer.

9. The avalanche photodiode according to claim 6, wherein
   a p-type peripheral area is provided around said conductive area in said semiconductor window layer; and
   said p-type peripheral area is formed shallower than said conductive area.

10. The avalanche photodiode according to claim 6, wherein
    said conductive area has a cross-sectional shape whose width is larger in said first window layer than in said second window layer.

* * * * *